United States Patent
Franz et al.

(10) Patent No.: US 9,529,395 B2
(45) Date of Patent: Dec. 27, 2016

(54) LIQUID TEMPERATURE CONTROL COOLING

(75) Inventors: John P. Franz, Houston, TX (US); Michael L. Sabotta, Houston, TX (US); Tahir Cader, Liberty Lake, WA (US); David A. Moore, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 77 days.

(21) Appl. No.: 14/376,138

(22) PCT Filed: Mar. 12, 2012

(86) PCT No.: PCT/US2012/028718
§ 371 (c)(1),
(2), (4) Date: Jul. 31, 2014

(87) PCT Pub. No.: WO2013/137847
PCT Pub. Date: Sep. 19, 2013

(65) Prior Publication Data
US 2014/0376176 A1   Dec. 25, 2014

(51) Int. Cl.
*G06F 1/20* (2006.01)
*H05K 7/20* (2006.01)
*F28D 15/02* (2006.01)

(52) U.S. Cl.
CPC ............... *G06F 1/20* (2013.01); *G06F 1/206* (2013.01); *H05K 7/20772* (2013.01); *H05K 7/20781* (2013.01); *F28D 15/0275* (2013.01)

(58) Field of Classification Search
CPC ......... G06F 1/20; G06F 1/206; H05K 7/20818
(Continued)

(56) References Cited

U.S. PATENT DOCUMENTS

| 5,228,385 A | 7/1993 | Friedrich |
| 5,370,178 A | 12/1994 | Agonafer |

(Continued)

FOREIGN PATENT DOCUMENTS

| CN | 2519983 Y | 11/2002 |
| CN | 1653612 | 8/2005 |

(Continued)

OTHER PUBLICATIONS

Anis Dehbi, "Efficient Electrothermal Simulation of Power Electronics for Hybrid Electric Vehicle," pp. 1-7, Apr. 20-23, 2008 http://www.technet-alliance.com/uploads/tx_caeworld/paper_eurosime32_killat_rudnyi.pdf.

(Continued)

*Primary Examiner* — David M Sinclair
*Assistant Examiner* — Robert Brown
(74) *Attorney, Agent, or Firm* — Brooks, Cameron & Huebsch, PLLC (57) ABSTRACT

Examples of the present disclosure may include methods and systems for liquid temperature control cooling. An example of a liquid temperature control cooling system for an electronics rack (100, 200a, 200b) can include a number of electronic devices (102, 202) in the electronics rack (100, 200a, 200b), a panel (108-1, 108-2, 208-1, 224-1, 224-2) that extends from a roof (226) to a floor (228) inside the electronics rack (100, 200a, 200b), where a face of the panel (108-1, 108-2, 208-1, 224-1, 224-2) is parallel to a direction in which the number of electronic devices (100, 200a, 200b) slide into the electronics rack (100, 200a, 200b) and perpendicular to a front of the electronics rack, and a heat receiving structure (112, 212, 312, 412) that is integrated into the panel (108-1, 108-2, 208-1, 224-1, 224-2) and that is thermally coupled to the number of electronic devices (102, 202) through the panel (108-1, 108-2, 208-1, 224-1,

(Continued)

224-2), where the heat receiving structure (112, 212, 312, 412) can include a liquid flow compartment (330, 442) an input (216, 316, 416) to receive cool liquid into the liquid flow compartment (330, 442), and a control valve (214, 314, 414-1, 414-2, 414-3, 414-4) to release warm liquid from the liquid flow compartment (330, 442).

15 Claims, 6 Drawing Sheets

(58) Field of Classification Search
USPC .......................................................... 361/699
See application file for complete search history.

(56) References Cited

U.S. PATENT DOCUMENTS

| | | | |
|---|---|---|---|
| 5,505,533 A | 4/1996 | Kammersqard | |
| 5,514,906 A | 5/1996 | Love | |
| 5,867,369 A | 2/1999 | Antonuccio | |
| 5,982,616 A | 11/1999 | Moore | |
| 5,986,882 A | 11/1999 | Ekrot et al. | |
| 6,084,769 A | 7/2000 | Moore et al. | |
| 6,111,749 A | 8/2000 | Lamb et al. | |
| 6,234,842 B1 | 5/2001 | Keay et al. | |
| 6,305,180 B1 | 10/2001 | Miller et al. | |
| 6,333,849 B1* | 12/2001 | Donahoe | G06F 1/203 361/679.47 |
| 6,377,453 B1 | 4/2002 | Belady | |
| 6,594,148 B1 | 7/2003 | Nguyen | |
| 6,600,649 B1 | 7/2003 | Tsai et al. | |
| 6,879,486 B1 | 4/2005 | Banton | |
| 6,987,673 B1 | 1/2006 | French | |
| 7,051,802 B2 | 5/2006 | Baer | |
| 7,057,893 B2* | 6/2006 | Nicolai | H05K 7/20781 165/104.33 |
| 7,106,590 B2 | 9/2006 | Chu et al. | |
| 7,298,619 B1 | 11/2007 | Malone et al. | |
| 7,318,322 B2 | 1/2008 | Ota et al. | |
| 7,393,236 B2 | 7/2008 | Thompson et al. | |
| 7,403,384 B2* | 7/2008 | Pflueger | H05K 7/20545 165/104.21 |
| 7,403,392 B2* | 7/2008 | Attlesey | G06F 1/20 165/104.33 |
| 7,450,378 B2 | 11/2008 | Nelson et al. | |
| 7,539,020 B2 | 5/2009 | Chow et al. | |
| 7,564,685 B2 | 7/2009 | Clidaras et al. | |
| 7,647,787 B2 | 1/2010 | Belady et al. | |
| 7,715,194 B2 | 5/2010 | Brewer et al. | |
| 7,718,891 B2 | 5/2010 | Adducci | |
| 7,724,524 B1* | 5/2010 | Campbell | H05K 7/20772 165/104.19 |
| 7,764,494 B2 | 7/2010 | Balzano | |
| 7,800,900 B1 | 9/2010 | Noteboom et al. | |
| 7,907,402 B2 | 3/2011 | Caveney | |
| 7,907,409 B2 | 3/2011 | Wyatt et al. | |
| 7,916,480 B2 | 3/2011 | Woody et al. | |
| 7,916,483 B2 | 3/2011 | Campbell et al. | |
| 7,957,132 B2* | 6/2011 | Fried | F28D 15/0266 165/185 |
| 7,961,475 B2* | 6/2011 | Campbell | H05K 7/20772 165/80.4 |
| 7,971,632 B2 | 7/2011 | Eriksen | |
| 8,004,832 B2 | 8/2011 | Brunschwiller et al. | |
| 8,014,150 B2 | 9/2011 | Campbell et al. | |
| 8,027,162 B2 | 9/2011 | Campbell et al. | |
| 8,050,036 B2 | 11/2011 | Suzuki et al. | |
| 8,089,766 B2* | 1/2012 | Attlesey | H05K 7/20772 165/104.19 |
| 8,164,901 B2* | 4/2012 | Neudorfer | G06F 1/20 165/104.21 |
| 8,194,406 B2 | 6/2012 | Campbell | |
| 8,327,656 B2* | 12/2012 | Tutunoglu | F24F 11/0086 361/688 |
| 8,351,206 B2* | 1/2013 | Campbell | H05K 7/20809 361/691 |
| 8,369,090 B2* | 2/2013 | Chester | H05K 7/20772 165/104.33 |
| 8,755,192 B1 | 6/2014 | Schrempp | |
| 2002/0163782 A1* | 11/2002 | Cole | F25B 39/028 361/700 |
| 2003/0231467 A1 | 12/2003 | Replogle | |
| 2004/0070949 A1 | 4/2004 | Oikawa et al. | |
| 2004/0201335 A1 | 10/2004 | Davis | |
| 2004/0221604 A1* | 11/2004 | Ota | H05K 7/20781 62/259.2 |
| 2005/0168945 A1 | 8/2005 | Coglitore | |
| 2005/0265004 A1 | 12/2005 | Coglitore | |
| 2005/0270751 A1 | 12/2005 | Coglitore | |
| 2005/0280986 A1 | 12/2005 | Coglitore | |
| 2006/0012959 A1* | 1/2006 | Lee | G06F 1/20 361/700 |
| 2006/0065874 A1* | 3/2006 | Campbell | H05K 7/20772 251/348 |
| 2006/0152238 A1 | 7/2006 | Beaman | |
| 2006/0176664 A1 | 8/2006 | Casebolt | |
| 2006/0176665 A1* | 8/2006 | Matsushima | G06F 1/206 361/679.47 |
| 2006/0278372 A1 | 12/2006 | Lai et al. | |
| 2007/0034354 A1 | 2/2007 | Tung et al. | |
| 2007/0119569 A1 | 5/2007 | Campbell et al. | |
| 2007/0163749 A1 | 7/2007 | Miyahara | |
| 2007/0258211 A1 | 11/2007 | Sonobe | |
| 2007/0259616 A1 | 11/2007 | Scattolin | |
| 2007/0274043 A1 | 11/2007 | Shabany | |
| 2007/0289718 A1 | 12/2007 | McCordic et al. | |
| 2007/0291452 A1 | 12/2007 | Gilliland et al. | |
| 2007/0297136 A1 | 12/2007 | Konshak | |
| 2008/0024977 A1 | 1/2008 | Coglitore | |
| 2008/0055846 A1 | 3/2008 | Clidaras | |
| 2008/0060372 A1* | 3/2008 | Hillis | H01L 23/467 62/259.2 |
| 2008/0232064 A1* | 9/2008 | Sato | H05K 7/20754 361/679.49 |
| 2008/0245083 A1* | 10/2008 | Tutunoglu | F24F 11/0086 62/115 |
| 2008/0271878 A1 | 11/2008 | Harvey et al. | |
| 2009/0021907 A1 | 1/2009 | Mann | |
| 2009/0052136 A1 | 2/2009 | Chung | |
| 2009/0065178 A1 | 3/2009 | Kasezawa | |
| 2009/0086426 A1 | 4/2009 | Brandon | |
| 2009/0129011 A1 | 5/2009 | Balzano | |
| 2009/0260777 A1* | 10/2009 | Attlesey | G06F 1/20 165/67 |
| 2009/0262495 A1 | 10/2009 | Neudorfer | |
| 2009/0266515 A1 | 10/2009 | Oikawa | |
| 2010/0003911 A1 | 1/2010 | Graczyk | |
| 2010/0032142 A1 | 2/2010 | Copeland et al. | |
| 2010/0033931 A1* | 2/2010 | Miyazawa | H05K 7/20745 361/696 |
| 2010/0051235 A1 | 3/2010 | Mori et al. | |
| 2010/0103614 A1* | 4/2010 | Campbell | H05K 7/20809 361/689 |
| 2010/0103618 A1* | 4/2010 | Campbell | H05K 7/20772 361/699 |
| 2010/0110621 A1 | 5/2010 | Dunn et al. | |
| 2010/0141379 A1 | 6/2010 | Tucker | |
| 2010/0149754 A1 | 6/2010 | Chapel et al. | |
| 2010/0165565 A1 | 7/2010 | Hellriegal | |
| 2010/0226094 A1* | 9/2010 | Attlesey | H05K 7/20772 361/699 |
| 2010/0236772 A1 | 9/2010 | Novotny et al. | |
| 2010/0248609 A1 | 9/2010 | Tresh | |
| 2010/0263830 A1 | 10/2010 | Noteboom | |
| 2010/0290190 A1* | 11/2010 | Chester | H05K 7/20772 361/701 |
| 2010/0319883 A1* | 12/2010 | Facusse | H05K 7/20809 165/104.26 |
| 2010/0326628 A1 | 12/2010 | Campbell et al. | |
| 2011/0045759 A1 | 2/2011 | Rasmussen et al. | |
| 2011/0056674 A1 | 3/2011 | Campbell et al. | |

(56) References Cited

U.S. PATENT DOCUMENTS

| | | | |
|---|---|---|---|
| 2011/0060470 A1* | 3/2011 | Campbell | G05D 23/1934 700/282 |
| 2011/0073726 A1 | 3/2011 | Bergesch | |
| 2011/0192568 A1 | 8/2011 | Hsieh | |
| 2011/0240281 A1 | 10/2011 | Avery | |
| 2011/0242760 A1 | 10/2011 | Bott et al. | |
| 2011/0303394 A1* | 12/2011 | Branton | H05K 7/20754 165/104.33 |
| 2011/0315353 A1* | 12/2011 | Campbell | H05K 7/20809 165/104.31 |
| 2012/0019115 A1 | 1/2012 | Dunwoody | |
| 2012/0050984 A1 | 3/2012 | Peng et al. | |
| 2012/0069514 A1 | 3/2012 | Ross | |
| 2012/0116590 A1 | 5/2012 | Florez-Larrahondo et al. | |
| 2012/0127655 A1* | 5/2012 | Tung | H05K 7/20781 361/679.47 |
| 2012/0325126 A1 | 12/2012 | Tran | |
| 2013/0077232 A1* | 3/2013 | Nordin | H05K 7/20818 361/679.47 |
| 2013/0081792 A1* | 4/2013 | Tufty | G06F 1/20 165/104.33 |
| 2013/0141863 A1* | 6/2013 | Ross | G11B 33/128 361/679.33 |
| 2013/0163185 A1* | 6/2013 | Gilges | G06F 1/20 361/679.41 |
| 2013/0308267 A1 | 11/2013 | Wu | |
| 2014/0033753 A1* | 2/2014 | Lu | F25B 49/02 62/190 |
| 2014/0038510 A1 | 2/2014 | Bailey | |
| 2014/0049146 A1 | 2/2014 | Kamaludeen | |
| 2014/0049914 A1* | 2/2014 | Campbell | F28D 1/0471 361/692 |
| 2014/0085821 A1* | 3/2014 | Regimbal | H05K 7/20236 361/699 |
| 2015/0003009 A1 | 1/2015 | Moore | |
| 2016/0066478 A1 | 3/2016 | Van Den Bergen | |

FOREIGN PATENT DOCUMENTS

| | | |
|---|---|---|
| CN | 101132688 | 2/2008 |
| CN | 101111734 B | 5/2010 |
| CN | 101893921 | 11/2010 |
| CN | 201654658 U | 11/2010 |
| CN | 201020130382. 7 | 11/2010 |
| CN | 102089727 | 6/2011 |
| CN | 102159058 A | 8/2011 |
| CN | 102189311 | 9/2011 |
| EP | 1860695 | 11/2007 |
| JP | 11220281 | 8/1999 |
| JP | 2000059062 | 2/2000 |
| JP | 2005228216 | 8/2005 |
| JP | 2010004736 | 1/2010 |
| KR | 100944890 | 3/2010 |
| KR | 20110004857 | 1/2011 |
| KR | 101103394 | 1/2012 |
| TW | M254049 | 12/2004 |
| TW | M312877 | 5/2007 |
| TW | M421677 A | 1/2012 |
| TW | 201221034 A | 5/2012 |
| TW | 201228570 A | 7/2012 |
| TW | 201249322 A | 12/2012 |
| WO | WO-2010062553 | 6/2010 |
| WO | WO-2011073668 | 6/2011 |
| WO | WO-2011092333 | 8/2011 |
| WO | WO-2011133166 | 10/2011 |
| WO | PCT/US2012/024564 | 2/2012 |
| WO | PCT/US2012/028718 | 3/2012 |
| WO | PCT/US2012/028744 | 3/2012 |
| WO | PCT/US2012/057739 | 9/2012 |
| WO | PCT/US2012/062874 | 10/2012 |
| WO | PCT/US2013/024037 | 1/2013 |

OTHER PUBLICATIONS

Bill Scofield, "Alcatel-lucent Modular Cooling System," 2010, 14 pages.
EPO, European Extended Search Report mailed Oct. 12, 2015, EP12871455.7, 12 pps.
EPO, Extended European Search Report, mailed Feb. 12, 2016, EP App No. 12871555.4 , 11 pps.
EPO, Extended European Search Report, mailed May 3, 2016, EP App. No. 12885470.0.
http://www.technet-alliance.com/uploads/tx_caeworld/paper_eurosime32_killat_rudnyi.pdf > On pp. 1-7, Efficient Electrothermal Simulation of Power Electronics for Hybrid Electric Vehicle, Dehbi, A. et al., Apr. 20-23, 2008.
ISA/KR, International Search Report mailed Oct. 12, 2012. PCT/US2012/024564, filed Feb. 9, 2012.
PCT/ISA/KR, International Search Report mailed Nov. 12, 2012. PCT/US2012/028744, 9 pps.
PCT/ISA/KR, International Search Report mailed Oct. 12, 2012. PCT/US2012/024564, 10 pps.
PCT/ISA/KR, International Search Report, mailed Nov. 14, 2012. PCT/US2012/028718, 9 pps.

* cited by examiner

LIQUID TEMPERATURE CONTROL COOLING

BACKGROUND

Electronic equipment cooling practices may typically include air convection systems. In air convection systems fans are used to force moving air past heat producing electronic components to remove heat. Air convection systems are mainly used in situations where there is a low power dissipation density of electronic components. However, as electronic components have grown more complex, air convection systems, in many instances, are insufficient to cool a high density of electronic components. Alternative cooling systems, such as liquid cooling systems, can require a high degree of maintenance and include a high degree of risk to the electronic components.

DETAILED DESCRIPTION

Examples of the present disclosure may include methods and systems for liquid temperature control cooling. An example of a liquid temperature control cooling system for an electronics rack can include a number of electronic devices in the electronics rack and a panel that extends from a roof to a floor inside the electronics rack, where a face of the panel is parallel to a direction in which the number of electronic devices slide into the electronics rack and perpendicular to a front of the electronics rack. The system can also include a heat receiving structure that is integrated into the panel and that is thermally coupled to the number of electronic devices through the panel, where the heat receiving structure can include a liquid flow compartment, an input to receive cool liquid into the liquid flow compartment, and a control valve to release warm liquid from the liquid flow compartment at least partially in response to the liquid reaching a particular temperature.

Examples of the present disclosure generally relate to the cooling of heat-generating components in an electronic apparatus. For example, a heat-generating component in an electronic apparatus can be a heat-generating computer component such as a processor chip (e.g., CPU and/or GPU), using heat pipes that can be thermally coupled to the side of an electronics rack.

As operating speeds and capacities of computer components keep increasing, it is becoming increasingly difficult to provide adequate cooling for processors and other heat generating components used in electronic equipment. This is particularly true in the case of computer components utilizing multiple processors. The use of air cooled heat sinks has successfully met cooling needs until recently. These metal heat sinks depend on air moving through the system to carry away heat. Air Cooled heat sinks have a number of disadvantages. Some disadvantages may include signal propagation delays due to longer distance between electronic components, package volume concerns (e.g., low density of computer components) due to wide spacing of multiple processors, and the restriction of air flow to electronic equipment. Some disadvantages may further include the need for system specific heat sinks and the non-uniform cooling of electronic equipment.

As an alternative to large heat sink forced air convective cooling approach (e.g., air cooling systems), liquid could be pumped through tubing to heat exchangers at each of the processor chips or other high heat-generating components (e.g., liquid cooling systems). Although liquid cooling may improve cooling performance relative to forced air convective cooling using large heat sinks, it would tend to present problems of its own. Some problems may include plumbing design problems, liquid leakage problems (e.g., within an electronics enclosure), processor upgrade problems, and pump reliability problems.

In some examples of the present disclosure, a dry disconnect liquid cooling system is presented to solve some of the problems mentioned above associated with air cooling systems and liquid cooling systems. In some examples of the present disclosure, a dry disconnect liquid cooling system can cool a number of computer components without presenting liquid leakage complications. In other examples of the present disclosure, a dry disconnect liquid cooling system can cool a high density of computer components (e.g., High Performance Computing (HPC) applications). In some examples of the present disclosure, a dry disconnect liquid cooling system can cool a number of computer components by using heat pipes that are more efficient than some previous approaches.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

Figure 1:
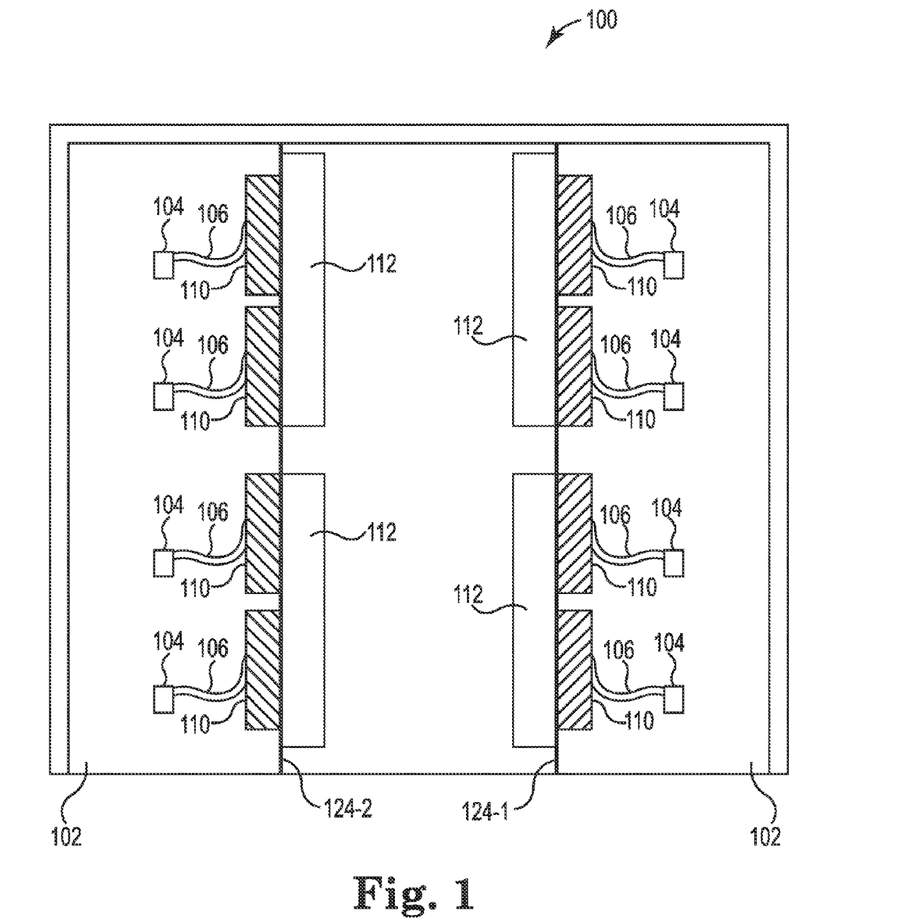
FIG. 1 is a cross-sectional view taken along a cut line X-X in FIG. 2 of an example of an electronics rack with a number of heat receiving structures according to the present disclosure.
Figure 2:
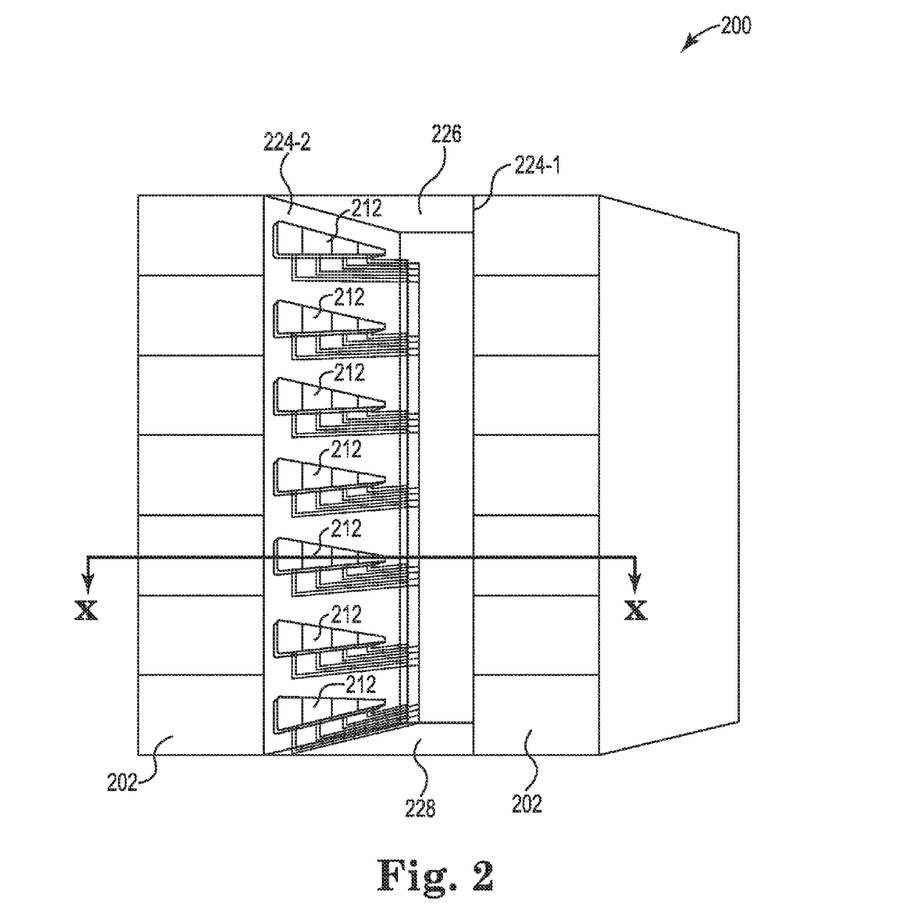
FIG. 2 illustrates an example of a frame with a with a plurality of electronics racks including a plurality of heat receiving structures mounted on an outer panel of an electronics rack, but internal to the frame, according to the present disclosure.

FIG. 1 is a cross-sectional view taken along a cut line X-X in FIG. 2 of an example of a frame 100 including a plurality of electronics racks 102 with a number of heat receiving structures/blocks 110 according to the present disclosure. In an example of the present disclosure, the frame 100 including the plurality of electronics racks 102 can include a rack mounting infrastructure to house electronic components or other types of heat producing equipment, although an electronics rack is not limited to housing the stated types of equipment. In one example embodiment, an electronics rack 102 can include a standard 19 inch rack. A standard 19 inch rack includes a front panel that is 19 inches wide, which includes the edges to which electronic components are mounted. In another example, an electronics rack 102 can include a front panel that is 23 inches wide. Examples used herein are illustrative and not limiting and can include a variety of front panel measurements. In an example of the present disclosure, the frame including an electronics rack 102 can be 42 units (U) tall, although an electronics rack is not limited to a height of 42 units. A unit (U) is one rack unit, which is an industry standard. A unit (U) may have a height equal to approximately 1.75 inches.

In some examples of the present disclosure, an electronics rack 102 can include a number of processors 104, a number of heat pipes 106, a number of heat blocks 110, and a number heat receiving structures 112. In some examples of the present disclosure, an electronics rack can include a front panel, a back panel, a number of side panels, and a number of internal panels. An inner panel can include a face which can be parallel to a direction in which computing devices slide into an electronics rack and perpendicular to the front of an electronics rack. For example, an electronics rack 102 can include a first internal panel 124-1 and a second internal panel 124-2 (referred to generally as internal panels 124).

In a number of examples of the present disclosure, an electronics rack 102 can include a number of electronic components (e.g., electronic devices, computing devices, etc.). For example, an electronics rack 102 can include computing devices in a High Performance Computing (HPC) environment 102. Computing devices can include server devices, storage devices and other computation centered devices having a number of processors 104. Processors can include processor chips or other electronic components that generate heat. Processors chips can include a core parallel processing units, graphics processing units (e.g., GPUs), and/or other integrated circuits and processing units. Electronic components that generate heat can include hard drives, memory DIMMs (e.g., dual in-line memory modules), and other forms of electronic storage. In some examples of the present disclosure, a processor 104 can be thermally coupled to heat pipes 106.

In a number of examples of the present disclosure, a heat pipe 106 can transfer heat between two solid interfaces. A heat pipe 106 can include a sealed pipe or tube that can be made from a material with high thermal conductivity. Examples of materials with high thermal conductivity include copper and aluminum, although other materials with high thermal conductivity can be used. A heat pipe 106, e.g., sealed pipe, can have all the air removed from the pipe. The sealed pipe can then have the air replaced with small amounts of a fluid to create a partial vacuum. Examples of fluid used in heat pipes 106 can include water, ethanol, acetone, sodium, and mercury among other fluids. A heat pipe 106 can include an evaporator and a condenser. For example, an evaporator of a heat pipe 106 can be thermally coupled to a first solid surface. In some examples, the first solid surface can be thermally coupled to a processor 104. Furthermore, a condenser of a heat pipe can be thermally coupled to a second solid surface. In some examples, the second solid surface can be thermally coupled to a heat block 110. The fluid in a heat pipe can arrive at the evaporator of a heat pipe 106 in a liquid phase. The fluid can transform from a liquid phase to a vapor phase as the fluid is heated at the evaporator of a heat pipe 106. The vapors can travel from the evaporator of a heat pipe 106 to the condenser of a heat pipe 106. The fluid can re-transform from a vapor phase to a liquid phase as the fluid condenses when it reaches the condenser of a heat pipe 106. The walls of a heat pipe can include a wicking structure to exert capillary pressure on the fluid in a liquid phase at the condenser of the heat pipe 106. The wicking structure can cause the condensed liquid to flow back to the evaporator of a heat pipe 106. In this manner the fluid in a heat pipe 106 can transfer heat from a processor 104 to a heat block 110.

Heat pipes can have some limitations. For example, heat pipes can be limited to transferring small heat loads over relatively short distances. A distance can be relatively short as compared to the dimensions and properties of a heat pipe. Heat pipes can lose some of their heat transferring properties when heat pipes transfer large heat loads over long distances. For example, heat pipes can lose some of their heat transferring properties when there is pressure loss in the heat pipes. Pressure loss can occur when fluid has to travel over a relatively long distance due to the liquid flow through the wicking structure and the viscous interaction between the fluid in a liquid phase and the fluid in a vapor phase.

In some examples of the present disclosure, a number of heat pipes 106 can be directed toward a first internal panel 124-1 and/or a second internal panel 124-2 associated with in an electronics rack 102. The number of heat pipes 106 can be directed toward internal panels 124 to control the distance between the number of processors 104 and a number of heat blocks 110. Moreover, the number of heat pipes 106 can be directed toward internal panels 124 to control the complexity of the pipe system that connects the number of heat pipes 106 to the number of heat blocks 110.

In some examples of the present disclosure, a number of heat pipes 106 can be thermally coupled to a number of heat blocks 110. A heat block 110 can include a square or a rectangular piece of material, although heat blocks can include other shapes. Examples of materials used in heat blocks can include aluminum and copper, although a heat block can be made from other materials and composites and/or alloys as well. Aluminum and copper can be used because the heat conductivity of aluminum and copper is greater than the heat conductivity of most materials. Furthermore, aluminum and copper can be used because of their conductive properties, ease of manufacturing, and compatibility with heat pipes.

In one or more embodiments a number of heat blocks 110 can be connected to one side, e.g., a first side, of internal panels 124 of an electronics rack 102 by a very high bond strength (VHB) adhesive. In other examples of the present disclosure, the number of heat blocks 110 can be connected to a side of internal panels 124 by a mounting system (not shown). A mounting system can include a clamping mechanism or other types of mechanisms to connect a number of heat blocks 110 to internal panels 124.

As shown in FIG. 1, a number of heat receiving structures 112 can be connected to an opposing side, e.g., second side, of internal panels 124 in an electronics rack 102 in association with the various heat blocks 110. The heat receiving structures 112 can be connected to internal panels 124 by a very high bond strength (VHB) adhesive and/or mounting system (not shown) as well. One or more heat blocks 110 can be connected to one or more heat receiving structures 112 according a particular design rule or implementation specification. The heat blocks 110 can be connected to the heat receiving structures 112 through internal panels 124 of an electronics rack 102. In some examples of the present disclosure, a number of heat blocks 110 can be connected to a number of heat receiving structures 112 by a mounting system (not shown) as well. Examples of heat receiving structures 112 are described in more detail below.

FIG. 2 illustrates an example of a frame with a with a plurality of electronics racks including a plurality of heat receiving structures mounted on an outer panel of an electronics rack, but internal to the frame, according to the present disclosure. In an example of the present disclosure, electronics rack 200 can include a number of computing devices 202. In some examples of the present disclosure, an electronics rack can include a number of internal panels. For example, an electronics rack 200 can include a first internal panel 224-1 and a second internal panel 224-2 (referred to generally herein as internal panels 224). For example, an internal panel 224 can be attached to a roof 226 of an electronics rack 200 and to a floor 228 of an electronics rack 200.

In a number of examples of the present disclosure, an internal panel 224 can be solid and continuous. In some examples of the present disclosure, an internal panel 224 can be part of the structure of an electronics rack 200. For example, an internal panel 224 can be structurally integrated into an electronics rack 200. An inner panel 224 can include a face which can be parallel to a direction in which computing devices 202 slide into an electronics rack 200 and perpendicular to the front of an electronics rack 200. In some examples of the present disclosure a number of heat receiving structures 212 can be mounted on the internal panels 224.

The placement of a number of heat receiving structures 212 in FIG. 2 can protect the number of heat receiving structures 212 in FIG. 2 by placing the heat receiving structures within electronics rack 200. Furthermore, the placement of a number of heat receiving structures 512 in FIG. 5 can provide greater access (e.g., maintenance) to the number of heat receiving structures 512 as compared to the placement of a number of heat receiving structures 212 in FIG. 2.

Figure 3:
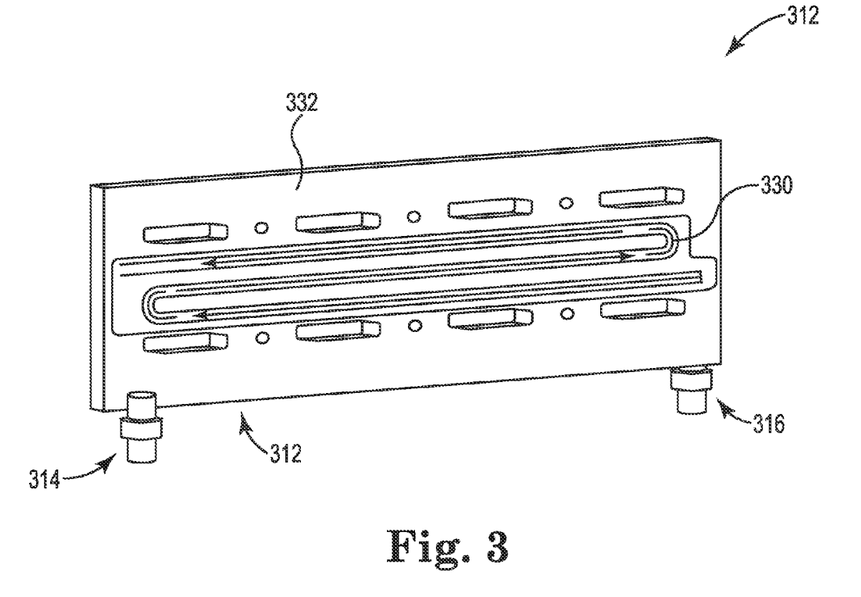
FIG. 3 illustrates a heat receiving structure with an inner serpentine channel compartment according to the present disclosure.

FIG. 3 illustrates a heat receiving structure with an inner serpentine channel compartment according to the present disclosure. The heat receiving structure 312 can be analogous to the heat receiving structure 112 illustrated in FIG. 1. In some examples of the present disclosure, a heat receiving structure 312 can include a liquid flow compartment. An example of a liquid flow compartment can be an inner serpentine channel compartment 330.

An inner serpentine channel compartment 330 can include a number of horizontal runs and a number of vertical runs through which the heat receiving structure transfers heat to a liquid, wherein the number of horizontal runs are longer than the number of vertical runs and the number of vertical runs are oriented vertically with respect to gravity. The inner serpentine channel compartment 330 can be in a square or rectangular shaped piece of material 332. In some examples of the present disclosure, the inner serpentine channel compartment can be connected to an input 316 and to a valve 314. A liquid can be pumped into the heat receiving structure 312 through the input 316 and into the inner serpentine channel compartment 330. In a number of examples, the heat receiving structure can transfer heat to the liquid. For example, as a liquid flows through the inner serpentine channel compartment 330 the temperature of the liquid can increase. In some examples of the present disclosure, the liquid can be released from the heat receiving structure 312 through valve 314.

Figure 4A:
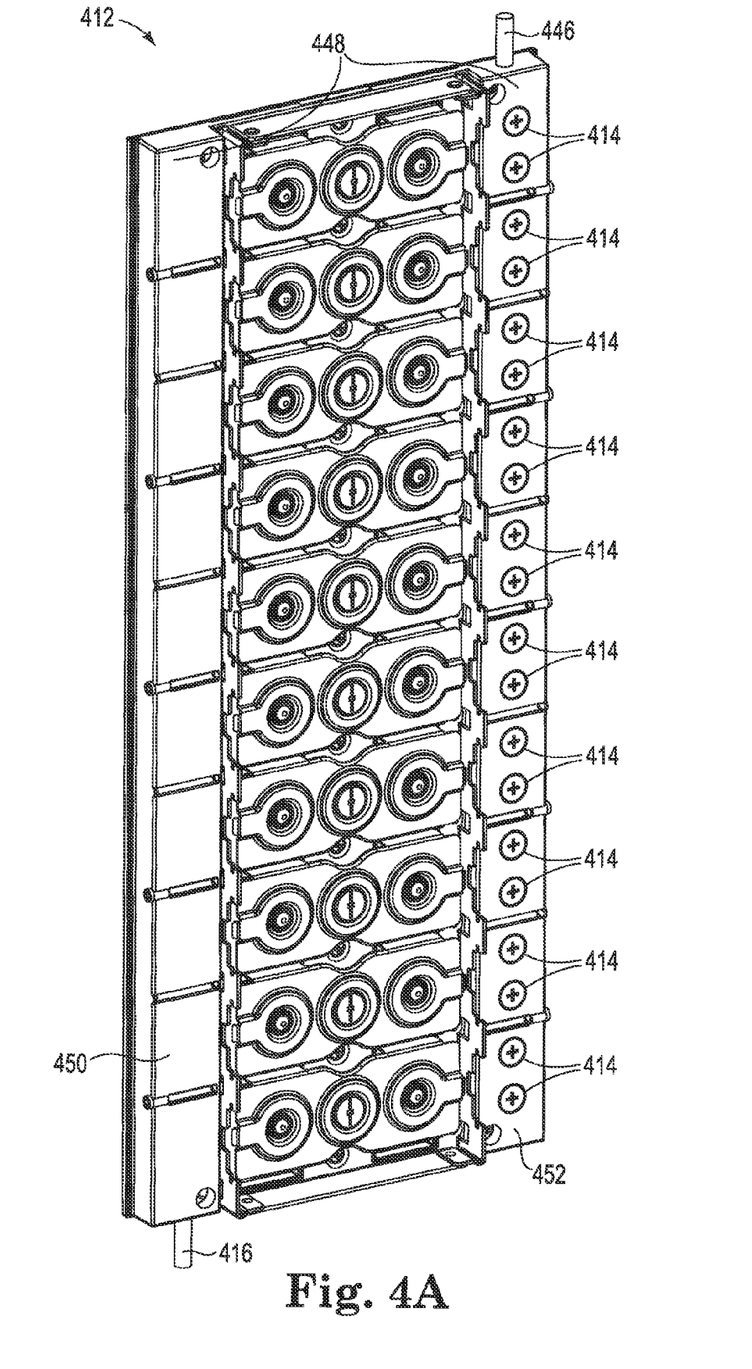
FIG. 4A illustrates a heat receiving structure with a pin fin array inner compartment according to the present disclosure.

FIG. 4A illustrates a heat receiving structure with a pin fin array inner compartment according to the present disclosure. The heat receiving structure 412 can be analogous to the heat receiving structure 112 illustrated in FIG. 1. In some examples of the present disclosure, a heat receiving structure 412 can include a number of pin-fin array inner compartments and a liquid channel outer compartment 448.

The liquid channel outer compartment 448 can include an input channel 450 and an output channel 452. The input channel 450 can be connected to a number of pin-fin array inner compartments through a number of openings that allow liquid to flow from an input 416 through the input channel 450 and into the number of pin-fin array inner compartments. The output channel 452 can be connected to the number of pin-fin array inner compartments through a number of valves 414. The number of valves 414 can allow liquid to exit the number of pin-fin array inner compartments into the output channel 452. The output channel 452 can allow liquid to flow from the number of pin-fin array inner compartments to the output 446.

In a number of examples of the present disclosure, the number of pin-fin array inner compartments can be connected to the liquid channel outer compartment 448 by a mounting mechanism, although the liquid channel outer compartment 448 can be connected to the pin-fin array inner compartments by a number of means. In some examples of the present disclosure, the liquid channel outer compartment 448 can be connected to ten pin-fin array inner compartments, although the liquid channel outer compartment 448 can be connected to more or less pin-fin array inner compartments. Each pin-fin array inner compartment from the number of pin-fin array inner compartments can be connected to the output channel 452 by two valves from the number of valves 414, although each of the pin-fin array inner compartments can be connected to the output channel 452 by more or less valves.

In a number of examples of the present disclosure, the valves that release liquid from the number of pin-fin array inner compartments to the output channel 452 can be configures to release liquid at a particular temperature. For example, a first valve can release liquid at a first temperature and a second valve can release liquid at a second temperature. The different temperatures can accommodate greater flexibility in flow control and temperature control of both the liquid and the computing devices.

Furthermore, the temperature of the liquid that is released through output 446 can be constant. That is, a number of valves 414 can open to release liquid as the temperature of the liquid in the number of pin-fin array inner compartments increases. The openings in a number of valves 414 can increase as the temperature of the liquid increases. The openings in a number of valves 414 can decrease as the temperature of the liquid decreases. That is, the openings in a number of valves 414 can release liquid at an increase rate or at a decreased rate depending on the temperature of the liquid. However, the temperature of the liquid that is released from the output 446 can remain constant regardless of the rate of release of the liquid from the valves 414.

Figure 4B:
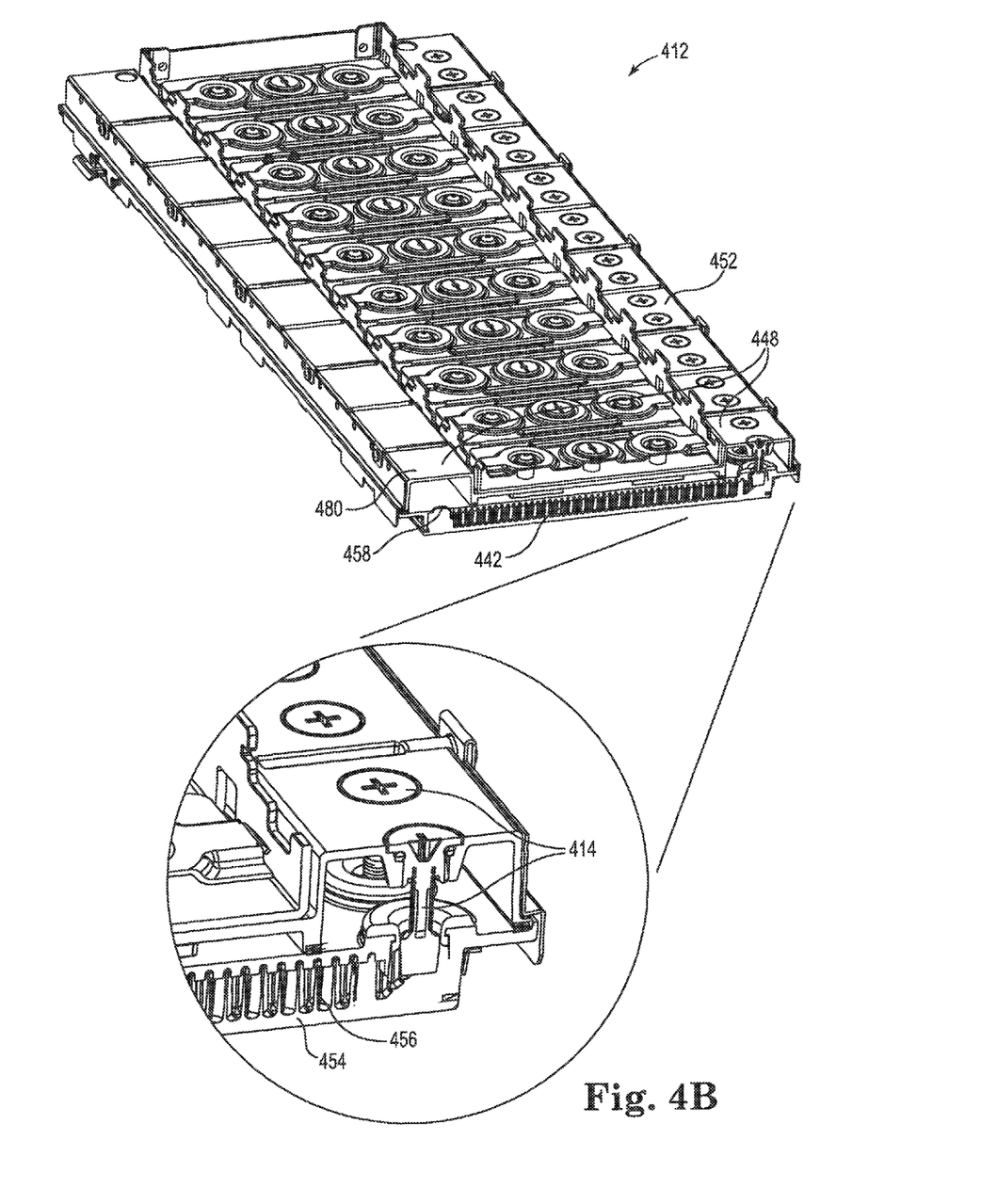
FIG. 4B illustrates a cross-sectional view of an example of a heat receiving structure with a pin fin array inner compartment according to the present disclosure.

FIG. 4B illustrates a cross-sectional view of an example of a heat receiving structure with a pin fin array inner compartment according to the present disclosure. In FIG. 4B, the heat receiving structure 412 can include a liquid channel outer compartment 448 and a pin-fin array inner compartment 442. The heat receiving structure 412 and the liquid channel outer compartment 448 can be analogous to the heat receiving structure 412 and the liquid channel outer compartment 448 illustrated in FIG. 4A.

In some examples of the present disclosure, a pin-fin array inner compartment 442 can include a plate 454 with a number of raised sections 456. A number of plates can be aligned along a length of the heat receiving structure 412. A number of plates can be in contact with the internal panel and/or the external panel. Plate 454 can include a square or rectangular plate, although plate 454 can include a number of shapes and/or sizes. The raised sections 456 can include a number of configurations, dimensions, and/or layouts.

The raised sections 456 can create a larger inner surface area in a pin-fin array inner compartment 442 than the inner surface area for a rectangular liquid flow compartment with no pin-fin array. The larger inner surface area can provide for greater heat exchange between the pin-fin array inner compartment 442 and a liquid that is flowing through the pin-fin array inner compartment because the larger surface area provides for greater contact between the liquid and the pin-fin array inner compartment 442 than a rectangular liquid flow compartment without a pin-fin array.

The heat receiving structure 412 can receive liquid through an input that can be connected to an input channel 450. In some examples of the present disclosure, a pin-fin array inner compartment 442 can be connected to an input channel 450 by a number of openings. For example, the liquid can flow through the input channel 450 and into the pin-fin array inner compartment 442 through an opening 458. In some examples of the present disclosure, a pin-fin array inner compartment 442 can be connected to an input channel by two openings, although the number of openings is illustrative and not limiting. The liquid can flow through the pin-fin array inner compartment 442. The liquid can be warmed as it passes through the pin-fin array inner compartment 442. The liquid can be released from the pin-fin array inner compartment 442 through a number of valves 414 into the output channel 452. The liquid can then travel through the output channel 452 and out of the heat receiving structure 412 through an output. The input channel 450 and the output channel 452 can be an enclosed hollow structures that allow liquid to pass through them.

Figure 5:
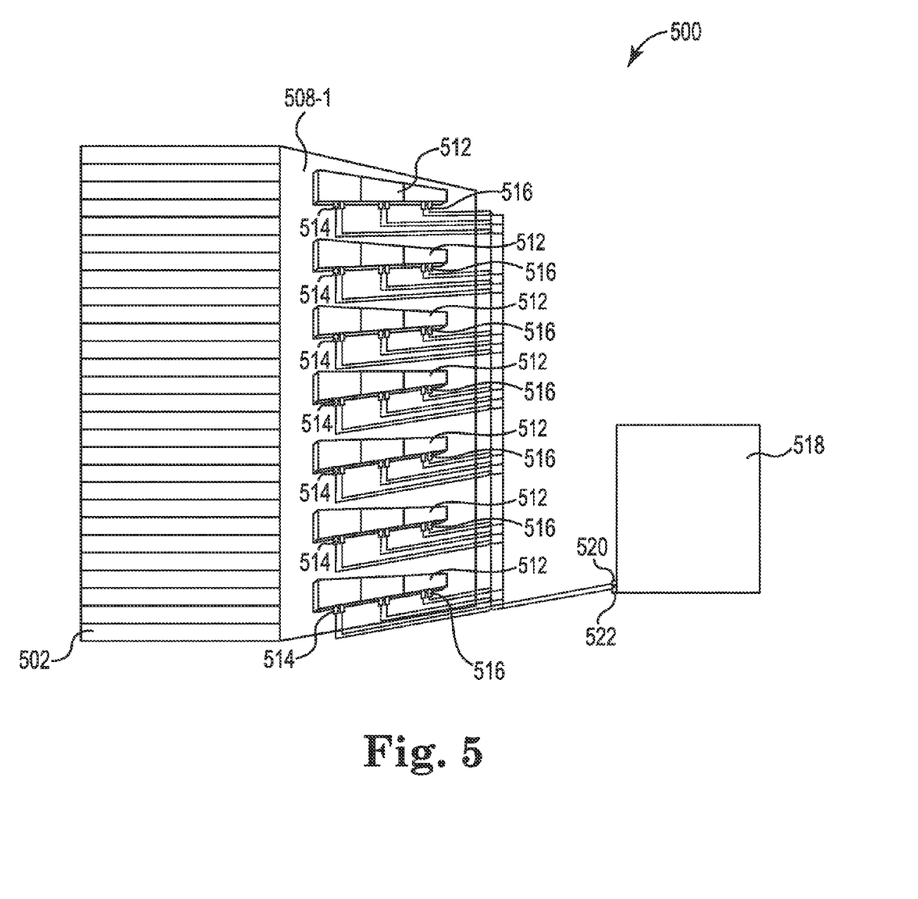
FIG. 5 illustrates an example of an electronics rack with a number of heat receiving structures mounted on an outer side of the electronics rack according to the present disclosure.

FIG. 5 illustrates an example of an electronics rack with a number of heat receiving structures mounted on an outer side of the electronics rack according to the present disclosure. In an example of the present disclosure, an electronics rack 500 can include a number of computing devices 502. In some examples of the present disclosure, the computing devices 502 can be thermally coupled to a number of heat receiving structures 512. The heat receiving structures 512 can be analogous to the heat receiving structure 112 illustrated in FIG. 1. In various examples of the present disclosure, a number of heat receiving structures 512 can be mounted on a side panel 508-1 on an outer side of the electronics rack 500.

In a number of examples of the present disclosure, a side panel 508-1 on an outer side of the electronics rack 500 can be solid. For example, side panel 508-1 can be a continuous and solid panel on the outer side of electronics rack 500. In some examples of the present disclosure, an outer panel can be part of the structure of an electronics rack 500. For example, outer panel 508-1 can be structurally integrated into an electronics rack 500. A face of an outer panel (e.g., side panel 508-1) can be parallel to a direction in which a number of computing devices 502 slide into the electronics rack 500 and perpendicular to a front of the electronics rack 500.

In a number of examples of the present disclosure, a number of heat receiving structures 512 can include a number of inputs 516 to allow cool liquid into a number of liquid flow compartments (not shown) in the number of heat receiving structures 512. In some examples of the present disclosure, a number of heat receiving structures 512 can include a number of control valves 514 to release warm liquid from the liquid flow compartment at least partially in response to the liquid reaching a particular temperature.

In some examples of the present disclosure, a control valve can be a thermostatic flow control valve. A thermostatic flow control valve can include temperature sensitive materials and a valve opening. The valve opening can change as a function of the temperature of a liquid flowing through it. Temperature sensitive materials can include wax, liquid, or gas, although temperature sensitive materials are not limited to the same. Temperature sensitive materials can expand and contract depending on the temperature of a liquid flowing through the thermostatic flow control valve. For example, a thermostatic flow control valve can allow a large flow of liquid through the valve opening when the liquid has a high temperature. Alternatively, a thermostatic flow control valve can allow a small flow of liquid through the valve opening when the liquid has a low temperature.

A thermostatic flow control valve can control the temperature of the liquid flowing from a heat receiving structure. For example, a number of heat receiving structures 512 can receive cool liquid from the inputs 516. The liquid can extract heat from a number of heat receiving structures 512. In some examples of the present disclosure, at lower server utilization, the liquid flow compartments in a number of heat receiving structures 512 can give a small flow of heat to a liquid because the heat a number of receiving structures 512 can receive a small flow of heat from the computing devices. The thermostatic flow control valve 514 can reduce the flow of liquid because the liquid will need more time in the liquid flow compartment to reach a particular temperature. In various examples of the present disclosure, at high server utilization, the liquid flow compartments in a number of heat receiving structures 512 can receive a large flow of heat from the computing devices. The thermostatic flow control valve 514 can increase the flow of liquid because the liquid will require less time in the liquid flow compartment to reach a particular temperature.

A cooling system 518 can be external to the electronics rack 500. Furthermore, the cooling system 518 can include an input 522 and an output 520. Warm liquid can flow into the cooling system 518 through the input 522 and cool liquid can flow from the cooling system 518 through the output 520. The warm liquid that can flow into the cooling system 518 through the input 522 can be the warm liquid that flows from a number of heat receiving structures 512. The cool liquid that can flow from the cooling system 518 through the output 520 can be the cool liquid that can flow into a number of heat receiving structures 512.

In a number of examples of the present disclosure, the cooling system 518 can be a district heating system. A district heating system can include distributing heat from a central location to a number of locations such as residential and commercial locations that use heat, although locations can include other locations that can use the heat. For example, the heat generated by the electronics rack 500 can be used to heat residential and/or commercial buildings. In some examples of the present disclosure, the electronics rack 500 can be used to heat residential and/or commercial buildings that house the electronics rack 500. In various examples of the present disclosure, the electronics rack 500 can be used to heat residential and/or commercial buildings that do not house the electronics rack 500. The warm liquid that flows from the thermostatic flow control valves 514 can flow into an input 522 of a heating system of a commercial building. The commercial building can cool the liquid which can then be pumped into the inputs 516 of a number of heat receiving structures 512 from the output 520 of a heating system of a commercial building.

In some examples of the present disclosure, the cooling system 518 can be an environmental cooling system. An environmental cooling system can include releasing heat into the open air. Open air can be any area that is not enclosed by a structure (e.g., a building). An environmental cooling system can release heat into the open air by circulating warm liquid from an electronics rack through the open air (e.g., area not enclosed by a structure). Circulating liquid through the open air can be useful in locations where outside temperature is low compared to the temperature of the warm liquid.

The above specification, examples and data provide a description of the method and applications, and use of the system and method of the present disclosure. Since many examples can be made without departing from the spirit and scope of the system and method of the present disclosure, this specification merely sets forth some of the many possible embodiment configurations and implementations.

What is claimed:

1. A liquid temperature control cooling system for an electronics rack, comprising:
   a number of electronic devices in the electronics rack;
   a panel that extends from a roof to a floor inside the electronics rack, wherein a face of the panel is parallel to a direction in which the number of electronic devices slide into the electronics rack and perpendicular to a front of the electronics rack; and
   a heat receiving structure that is integrated into the panel and that is thermally coupled to the number of electronic devices through the panel, wherein the heat receiving structure includes:
      a liquid flow compartment;
      an input to receive cool liquid into the liquid flow compartment; and
      at least one flow control valve to change a release rate of warm liquid from the liquid flow compartment at least partially in response to a temperature of the warm liquid flowing through the at least one flow control valve.

2. The system of claim 1, wherein the heat receiving structure is liquidly isolated from the number of computing devices.

3. The system of claim 1, wherein the liquid flow compartment includes a serpentine channel including a number of horizontal runs and a number of vertical runs through which the heat receiving structure transfers heat to the liquid, wherein the number of horizontal runs are longer than the number of vertical runs and the number of vertical runs are oriented vertically with respect to gravity.

4. The system of claim 1, wherein:
   the liquid flow compartment includes a pin-fin array compartment, an input channel and an output channel; and
   the pin-fin array compartment includes a plate with a number of raised sections through which heat is transferred to the liquid and the at least one flow control valve changes the release rate of warm liquid from the pin-fin array compartment.

5. The system of claim 4, wherein the at least one flow control valve comprises at least two flow control valves.

6. A liquid temperature control cooling system for an electronics rack, comprising:
   a number of computing devices in the electronics rack;
   a heat block being mounted to a side of the electronics rack;
   a number of heat pipes to transfer heat from the computing devices to the heat block; and
   a heat receiving structure, outside of the electronics rack, that is thermally coupled to the heat block to receive heat therefrom, wherein the heat receiving structure includes:
      a liquid flow compartment;
      an input to receive cool liquid into the liquid flow compartment; and
      a number of flow control valves to release warm liquid from the liquid flow compartment at least partially in response to liquid reaching a particular temperature, wherein the number of flow control valves comprises
         a first group of flow control valves to release the warm liquid from the liquid flow compartment at least partially in response to the warm liquid reaching a first particular temperature; and
         a second group of flow control valves to release the warm liquid from the liquid flow compartment at least partially in response to the warm liquid reaching a second particular temperature, wherein the first particular temperature is different than the second particular temperature.

7. The system of claim 6, further comprising a cooling structure that is connected to the input and the number of flow control valves, wherein the cooling structure cools the liquid.

8. The system of claim 6, wherein:
   the first group of flow control valves and the second group of flow control values control a flow of the liquid, a temperature of the liquid, and a temperature of the number of computing devices.

9. The system of claim 6, wherein the number of heat pipes are thermally coupled to the computing devices.

10. The system of claim 6, wherein the heat block is mounted opposite the heat receiving structure, and wherein thermal coupling between the heat block and the heat receiving structure occurs through the side of the electronics rack.

11. The system of claim 10, wherein the side of the rack includes a mounting location where the heat block is mounted opposite the heat receiving structure and wherein the mounting location includes a material that enhances thermal conductivity.

12. A method for providing a liquid temperature control cooling system for an electronics rack, comprising:
   providing a panel in the electronics rack parallel to a number of electronic devices in the electronics rack and perpendicular to a front of the electronics rack, the panel having a number of heat blocks secured thereto and at least one heat receiving structure secured thereto to receive heat from the number of heat blocks;
   providing a cool liquid input into the heat receiving structure to cool the heat receiving structure;
   providing a thermostatic flow control valve comprised of a temperature sensitive material on the heat receiving structure to release warm liquid, wherein the temperature sensitive material changes the thermostatic flow control valve at least partially in response to the liquid reaching a particular temperature; and
   providing a cooling system that is external to the electronics rack, to cool the liquid released from the thermostatic flow control valve.

13. The method of claim 12, wherein providing the external cooling system includes providing a connection between a district heating system, external to the rack, and the thermostatic flow control valve to cool the liquid that is released from the heat receiving structure via a building including the district heating system.

14. The method of claim 12, wherein providing the external cooling system includes providing a connection between an environmental cooling system, external to the rack, and the thermostatic flow control valve to cool the liquid that is released from the heat receiving structure via atmospheric temperatures in the environmental cooling system.

15. The method of claim 12, wherein providing the panel includes:
   providing a panel wherein the heat receiving structure is integrated into the panel;
   providing a panel that is part of a structure of the electronics rack; and
   providing a panel that extends from a roof of the electronics rack to a floor of the electronics rack.

* * * * *